United States Patent
Crittenden et al.

(10) Patent No.: US 6,420,899 B1
(45) Date of Patent: Jul. 16, 2002

(54) DYNAMIC IMPEDANCE MATCHED DRIVER FOR IMPROVED SLEW RATE AND GLITCH TERMINATION

(75) Inventors: Brent S. Crittenden, Gilbert, AZ (US); Andrew M. Volk, Granite Bay; Timothy J. Maloney, Palo Alto, both of CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/750,134

(22) Filed: Dec. 29, 2000

(51) Int. Cl.[7] ............................................. H03K 17/16
(52) U.S. Cl. ............................. 326/30; 326/87; 326/26
(58) Field of Search ............................. 326/30, 26, 27, 326/87, 83, 86

(56) References Cited

U.S. PATENT DOCUMENTS 5,528,166 A * 6/1996 Iikahar ...................... 326/27
5,898,321 A    4/1999 Likbahar et al. ............. 326/87
5,963,047 A * 10/1999 Kwong et al. ................ 326/27
6,242,942 B1 * 6/2001 Shamarao .................... 326/27
6,297,677 B1 * 10/2001 Ang et al. ................... 327/170

FOREIGN PATENT DOCUMENTS

WO    WO 99/06845    11/1999

* cited by examiner

*Primary Examiner*—Michael Tokar
*Assistant Examiner*—Ahn Q. Tran
(74) *Attorney, Agent, or Firm*—Kenyon & Kenyon

(57) ABSTRACT

The impedance of a driver driving a load on the other end of a transmission line is dynamically changed to improve slew rate and glitch termination. The driver is controlled to have a low impedance during an initial part of an edge transition, giving the strong drive needed at that time. At a first predetermined position in the edge transition, approximately equal to the flight time, the driver impedance is raised to a value approximately equal to the transmission line impedance to effectively terminate any reflected signals.

30 Claims, 10 Drawing Sheets

Delay 1 is logic delay of 2X EN path and allows 1X buffer to start transition (reduced di/dt).

Delay 2 is sufficient to allow combo buffer to drive pad to near incident level (shelf), but less than round trip delay of external network. (Launched wave must cause receiver to see valid level with good margin.)

(Pad input not used)

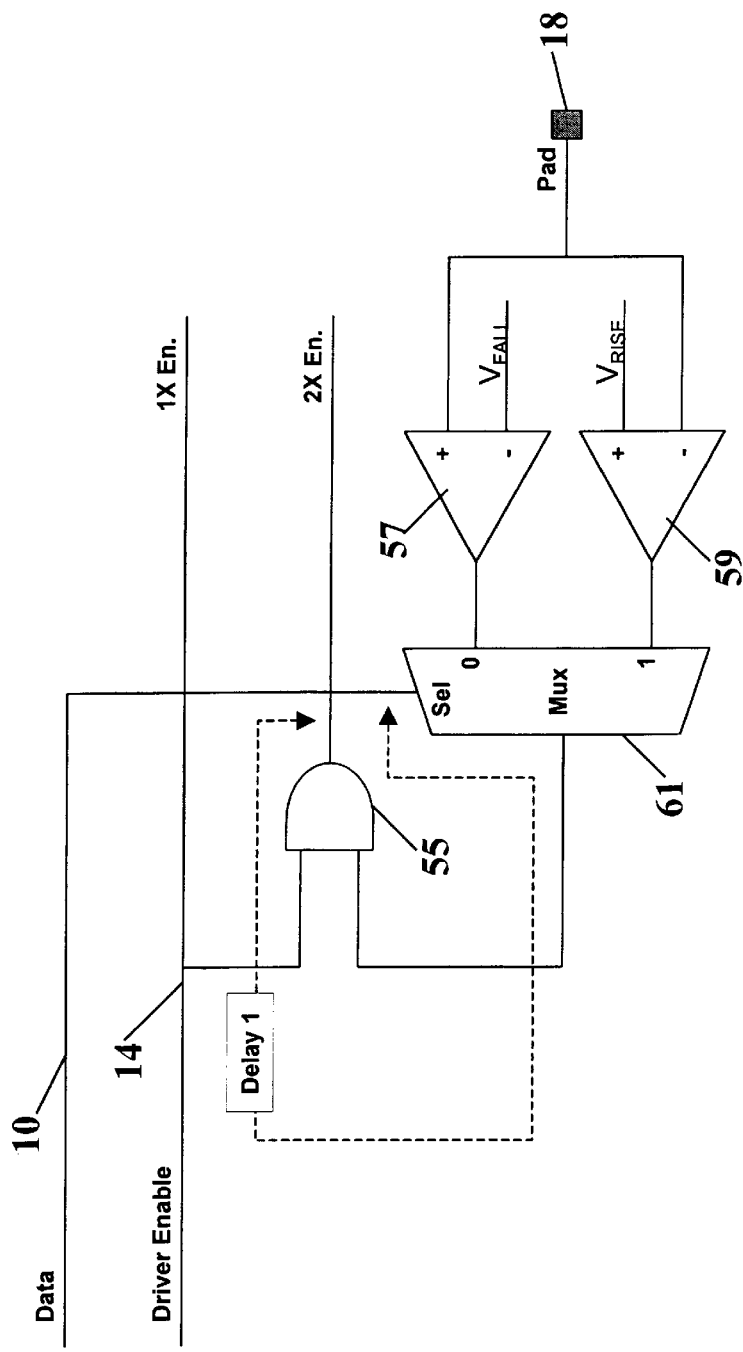

Delay 1 is logic delay of 2X EN path and allows 1X buffer to start transition (reduced di/dt).

$V_{RISE}$, $V_{FALL}$ are set to be encountered before transition hits the shelf, but outside of pad noise. The delay through the buffers plus Delay 1 must be less than the time for the reflected wave to return from the load.
(One of these input buffers may be also be the data input buffer for this pin.)

Fig. 4

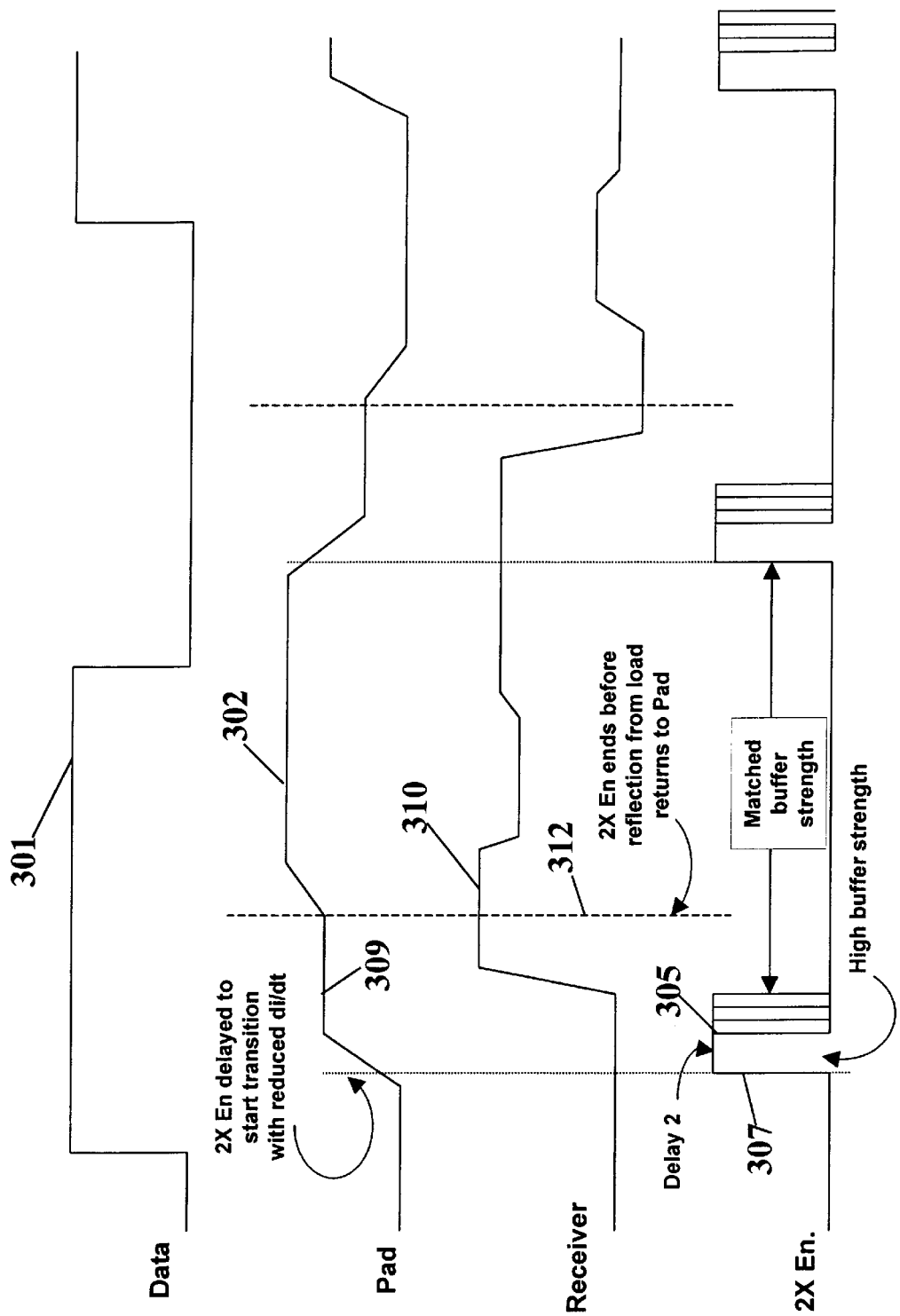

DYNAMIC IMPEDANCE MATCHED DRIVER FOR IMPROVED SLEW RATE AND GLITCH TERMINATION

FIELD OF THE INVENTION

Embodiments of the present invention relate to a dynamic impedance matched driver which gives improved slew rate and glitch termination.

BACKGROUND OF THE INVENTION

As system performance has increased, associated input and output delays have decreased. Recent high-speed requirements have forced output buffer designers to push buffer impedance much lower than the transmission line impedance they are driving in order to meet timings. This is due to the far end receiver requiring the received signal to be driven to valid Vil and Vih limits with multiple loads within a single time of flight. Multiple loads often result in parallel transmission lines and reduced transmission line impedance where the transmitted signal energy is shared among each path.

Drivers must maintain a close impedance match to the minimum transmission line impedance during switching. These lines may be parallel transmission lines and loads. This allows for the switching to occur with only one flight time delay. However, when reflections are received at the driver, an unmatched near end termination will result in a negative wave propagation back down the line. A matched impedance at the driver or near end will terminate incident waves because the reflection coefficient is zero or near zero.

For quiet lines, simultaneous switching noise can propagate from the buffer's power supply rails, through the quiet buffer, and onto the transmission line. As the driver impedance becomes less than the line impedance, the energy transferred onto the transmission line increases. But practical circuit board and package design usually induces crosstalk and power-delivery noise onto the signal lines, which we will call simultaneous switching output (SSO) noise.

A need, therefore, exists for an improved termination arrange reduces or addresses these problems.

BRIEF DESCRIPTION OF THE DRAWINGS

FIG. 4 is a block/logic diagram of an embodiment of a first voltage based buffer control which can be used in the embodiment of FIG. 2.

FIG. 5 is a waveform diagram helpful in understanding the operation of the embodiment of FIG. 3.

FIG. 8A is a block/logic diagram of an embodiment of a fourth voltage based buffer control which is a simplified form of the embodiment of FIG. 8.

DETAILED DESCRIPTION

Embodiments of methods and circuits for providing a dynamic impedance matched driver are described. In the following description, for purposes of explanation, numerous specific details are set forth to provide a thorough understanding of the present invention. It will be appreciated, however, by one skilled in the art, that the present invention may be practiced without these specific details. In other instances, structures and devices are shown in block diagram form. Furthermore, one skilled in the art can readily appreciate that the specific sequence in which methods are presented and performed are illustrative and it is contemplated that the sequences can be varied and still remain within the spirit and scope of the present invention.

It can be shown via simulation and mathematics, that when a driver is substantially matched to a transmission line substantial glitch reduction can be attained when a glitch is launched toward the buffer. This applies, in particular, where a quiet line is surrounded by lines on which transitions are launched and is thus subject to crosstalk. In that case a backward going crosstalk wave can return to the quiet buffer and cause problems if not properly terminated. Thus, in accordance with embodiments of the present invention, glitches arriving at a z-matched buffer are terminated such that the reflection coefficient is zero.

It can also be shown through simulation and mathematics that SSO noise from a buffer is minimized when a driver is substantially impedance-matched (z-matched) to the transmission line. For a quiet line with SSO noise on its power lines, a matched buffer transmits less of the SSO noise than a stronger unmatched buffer. (A weaker buffer would transmit less SSO noise, but is worse for terminating and resisting influences of impinging waves). In embodiments of the present invention, the SSO noise at the pad is, thus, limited to half the noise seen on the supply rail for a launched wave on a quiet line when the driver is substantially matched to the transmission line (i.e., $Z_{BUFFER}=Z_0$ and the noise divides evenly across the impedance). In practice, the buffer impedance is substantially, and sufficiently, matched to the transmission line, e.g., a trace on the circuit, when it is within about 10% of the center of the distribution of trace impedance.

Figure 1:
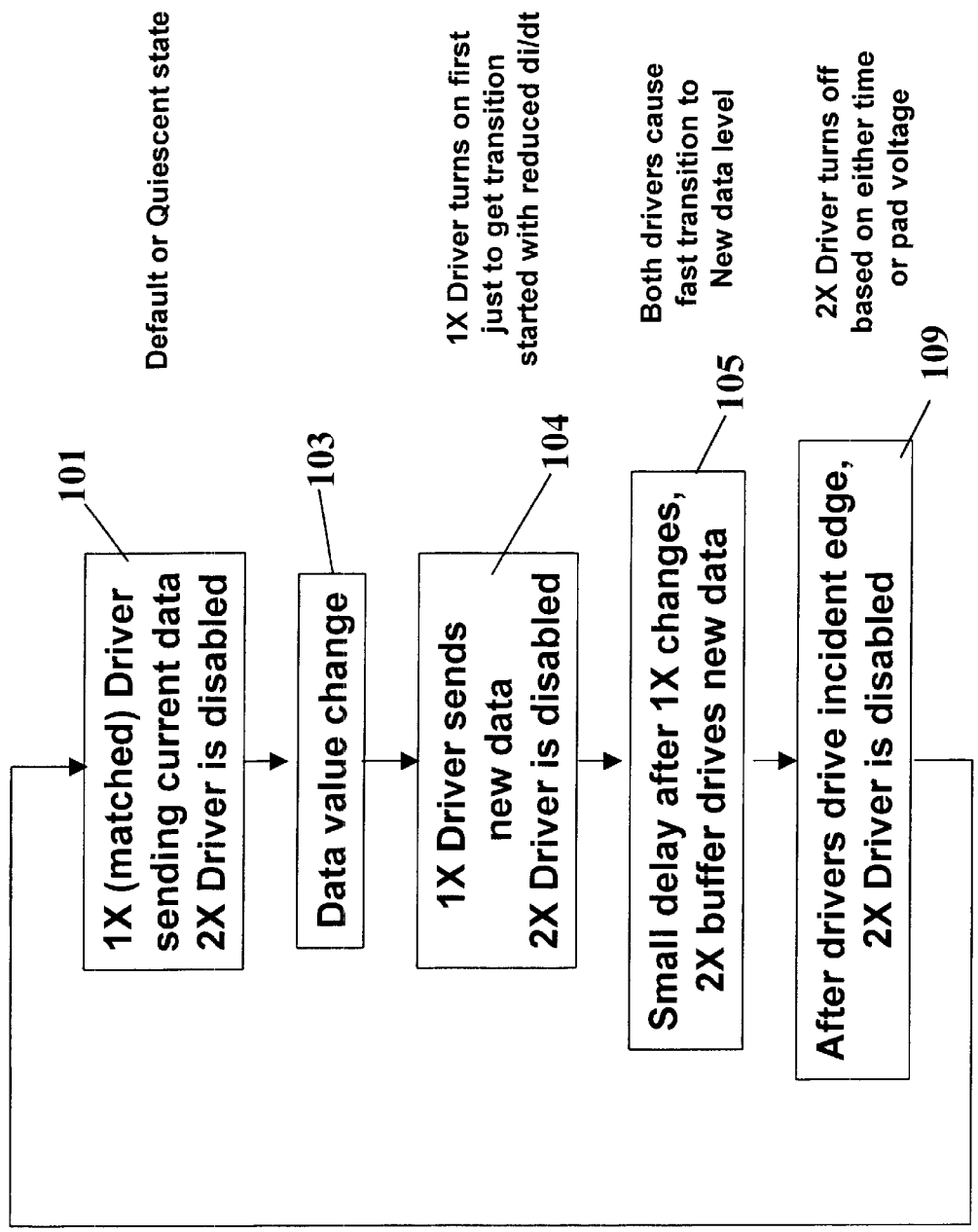
FIG. 1 is a flow diagram illustrating an embodiment of the present invention.
Figure 2:
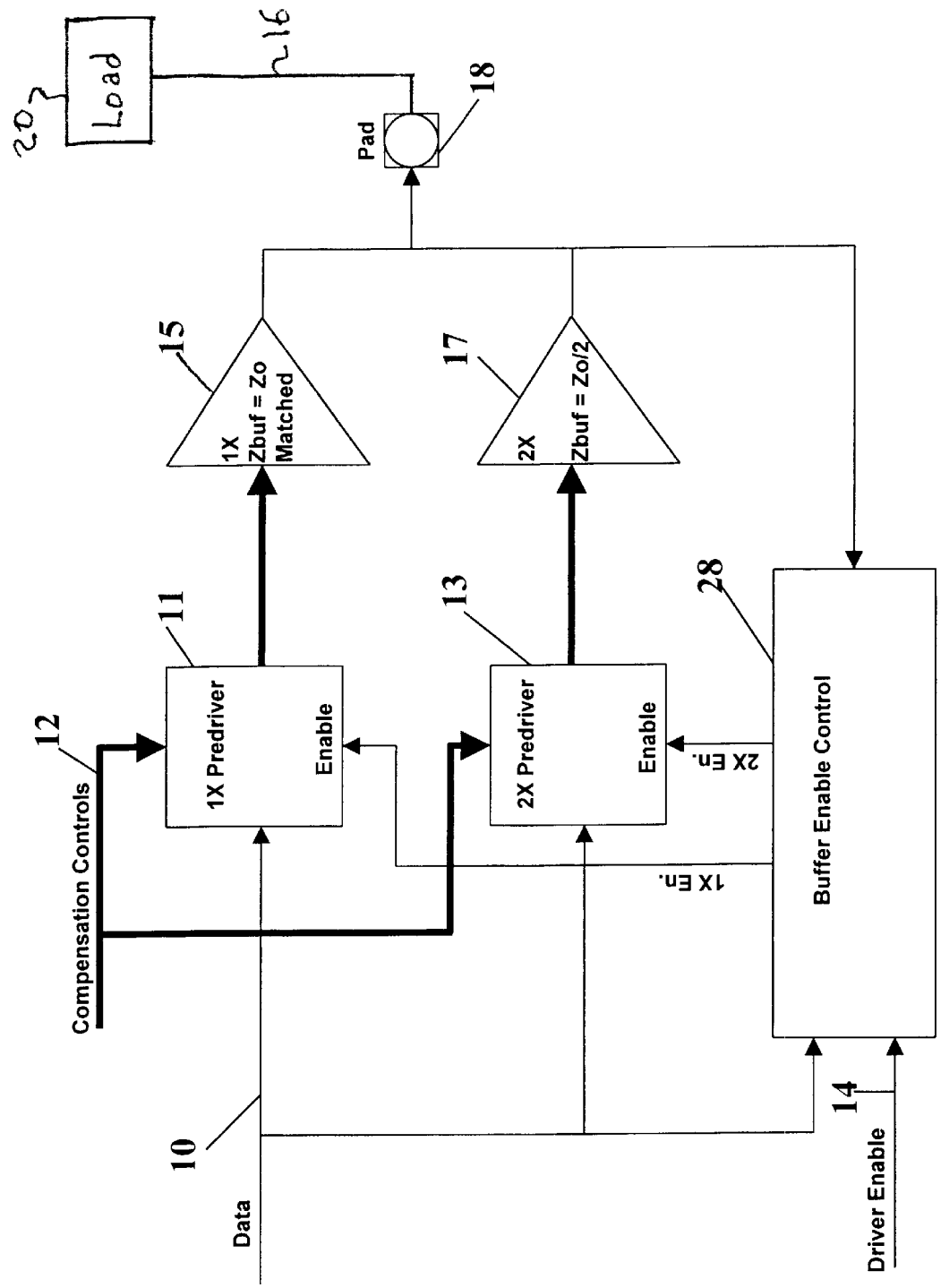
FIG. 2 is a block diagram of a dynamic impedance matched driver circuit in accordance with an embodiment of the present invention.

FIG. 1 is a flow diagram and FIG. 2 a block diagram of an embodiment according to the present invention. In the exemplary embodiment illustrated, the circuit comprises a dual buffer driver. Thus, there is shown in the embodiment of FIG. 2, a buffer driver 15 and a buffer driver 17, with respective pre-drivers 11 and 13. Buffer drivers 15 and 17 are tuned to specific impedances via DC resistive compensation techniques as known in the art. Such techniques are disclosed, for example, in WO 99/06845 and U.S. Pat. No. 5,898,321, both of which are assigned to Intel Corporation of Santa Clara, Calif., the assignee of the present invention. Control inputs on line 12, result in outputs from pre-drivers 11 and 13 which control a plurality of switches in each of buffer drivers 15 and 17. The impedances may be set up initially and may, if desired, be dynamically controlled to account for changes in temperature etc.

Thus, as illustrated in the block diagram of FIG. 2 the embodiment shown includes a buffer driver 15 controlled to an impedance $Z_0$ and buffer driver 17 controlled, for example, to an impedance $Z_0/2$. As a result, in this embodiment of the present invention, the stage comprising pre-driver 11 and buffer driver 15 is tuned to match the transmission line impedance based on the compensation control input on line 12. The other stage comprising pre-driver 13 and buffer driver 17 is tuned to a strength to meet the timing requirements of the interface using the same method of compensation as the first, or scaled from the initial compensation value again using the compensation control input on line 12.

In the embodiment shown in the block diagram of FIG. 2, the second buffer is at half the characteristic transmission line impedance. For example, in an application with a characteristic impedance of 60 ohms, both drivers operating during the transition phase would have a driver impedance of 20 ohms. This would match a Star topology transmission line with 3 loads. However, depending on requirements regarding what must be driven, this could be a different value. In general, while the first buffer driver must have an impedance substantially equal to $Z_0$, the second buffer driver need only lower the impedance of the two drivers in parallel to properly drive the load. Thus, although it is at half the characteristic transmission line impedance in the illustrated embodiment, such is not necessary.

In the embodiment illustrated by FIG. 2, incoming data on line 10 is coupled to both pre-driver 11 and pre-driver 13. The outputs of buffer drivers 15 and 17 are coupled to an output pad 18. In conventional fashion, pad 18 is coupled via a transmission line, e.g., a trace to a load such as a memory. The data on line 10 and the output on pad 18 are provided as inputs to a buffer enable control to be described in more detail below. Buffer enable control, which also receives an input from a driver enable line 14, provides enable inputs to each of the pre-drivers 11 and 13. Normally, anytime line 14 is asserted, the pre-driver 11 and driver 15 are enabled.

The operation of the embodiment of FIG. 2 proceeds as illustrated in the flow chart of FIG. 1. The process starts, as indicated by block 101 in a quiescent state, with the buffer driver 15 sending current data and buffer driver 17 disabled. As shown by block 103, a pulse transition starts as a result of the data value change. This is illustrated by pulse 301 of FIG. 5. The buffer driver 15 initially continues to send the new data with the buffer driver 17 disabled to get the transition started as indicated by block 104. By driving only with the buffer driver 15 initially, a soft start with reduced noise results. In the embodiment illustrated by FIGS. 1 and 2, the buffer enable control 28, after a small delay, senses a predetermined progression of the leading edge of the pulse. This can be done, for example, with a time measurement after the transition of data input 10 or a voltage measurement at pad 18. Once a predetermined change takes place, the driver 17 is turned on as indicated by block 105. This is done by providing an enable input from buffer enable control 28 to pre-driver 13 to turn driver 17 on.

Although the soft start is preferred, it would be possible to skip the delay and turn on the driver 17 as soon as the data transition 103 occurs. Further, although a rising edge of a pulse has been used as an example in FIG. 5, the same steps apply to a falling edge of a pulse This manner of operation results in a strong drive into the load, meeting its requirements in terms of timing and voltage at the load, which can be, for example, a memory, such as a DIMM (Dual In-line Memory Module). Thus, when the output is between the two sensed positions, both buffers are enabled in parallel and the driver impedance is greatly reduced. This creates an unmatched condition and allows the driver to overdrive the transmission line, to guarantee timings are met at the far end to Vil and Vih. However, if the impedance remains at the value needed to strongly drive the load, it will not properly terminate a pulse reflected from the load. In the worst case, this can set up an oscillation in the transmission line.

Thus, as indicated by block 109, the buffer enable control 28 senses another point on the pulse, for example, the ledge 302 on the waveform 301, i.e., the point where waveform 310, the pulse at the load, in this case a DIMM, crosses the waveform 302. This is an ideal point. However, anywhere from where the waveform turns over into the ledge 302 up to the point before the ledge starts steeply upward again may be used for disabling driver 17. In response to sensing this point, again based on time or voltage, the buffer enable control 28 removes the enable from pre-driver 13 turning off buffer driver 17. Now, the impedance at terminal 18 matches the transmission line and the reflected pulse is properly terminated. This must be timed to occur before wave 310 is reflected from the load.

Figure 3:
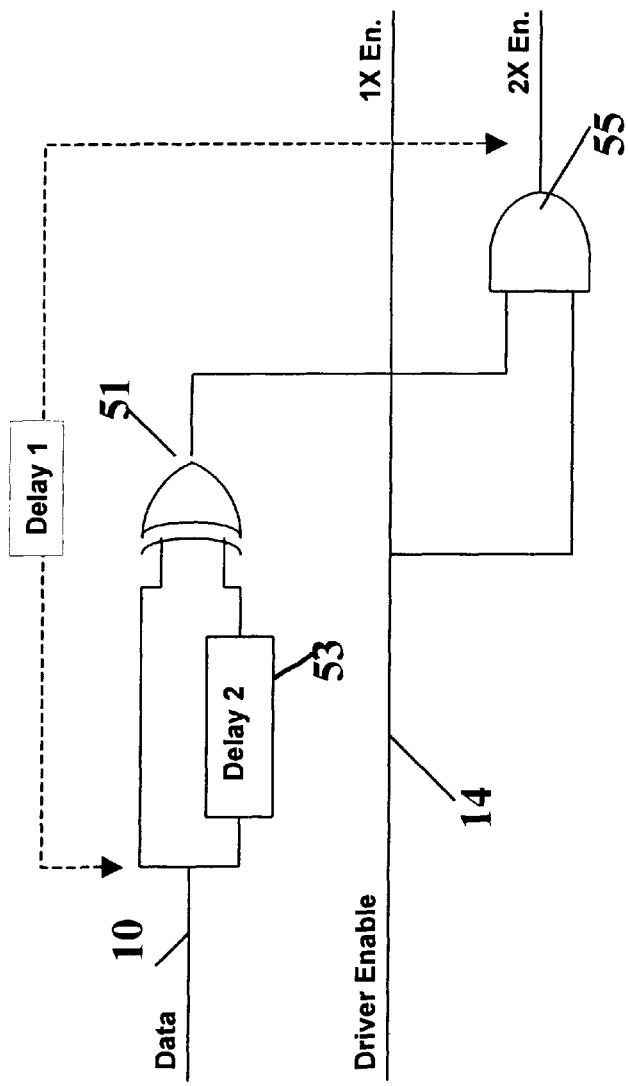
FIG. 3 is a block/logic diagram of an embodiment of a time based buffer control which can be used in the embodiment of FIG. 2.

FIG. 3 illustrates one embodiment of buffer enable control 28 according to the present invention based on time. Data on line 10 is coupled directly into an exclusive OR gate 51 and also to a second input of gate 51 via a delay 53. The data is shown as waveform 301 of FIG. 5 The output of gate 51 is one input to an AND gate 55. The driver enable line 14 is coupled directly to the enable input of the pre-driver 11. The delay through gate 51 and gate 55, indicated as delay 1 on the drawing, is sufficient to give a soft start to the transition and reduce di/dt. Thus, as shown by waveform 305, which shows the enable signal to the pre-driver 13, there is a delay with respect to the beginning of the rise of the waveform 302 at output terminal 18. After this delay, gate 55 is enabled, as shown by the change in waveform 305 at point 307 and buffer driver 17 is turned on to provide high buffer strength. After the delay 2, combined buffer drivers 15 and 17 have driven the pad 18 to a sufficient level to guarantee proper input levels at the load. This delay will be near shelf 309 of FIG. 5 but less than the round trip delay of the external network. The waveform at the receiver is indicated at 310 of FIG. 5. As indicated by dotted line 312, the disabling of the buffer driver 17 occurs before the reflection from the load returns from the load.

FIG. 4 illustrates another embodiment of buffer enable control 28 according to the present invention based on voltage. In this embodiment, the second input to gate 55 is from the output of a multiplexer 61 having as its two signal inputs the outputs of comparators 57 and 59. Comparator 57 has as its positive input a line coupled to the output terminal 18 and as its negative input a voltage $V_{FALL}$. Comparator 59 has as its positive input $V_{RISE}$ and as its negative input the voltage at output pad 18. The selection input to multiplexer 61 is from the data line. Thus, for data which is high, comparator 59 will be selected and for data which is low, comparator 57 will be selected.

Figure 6:
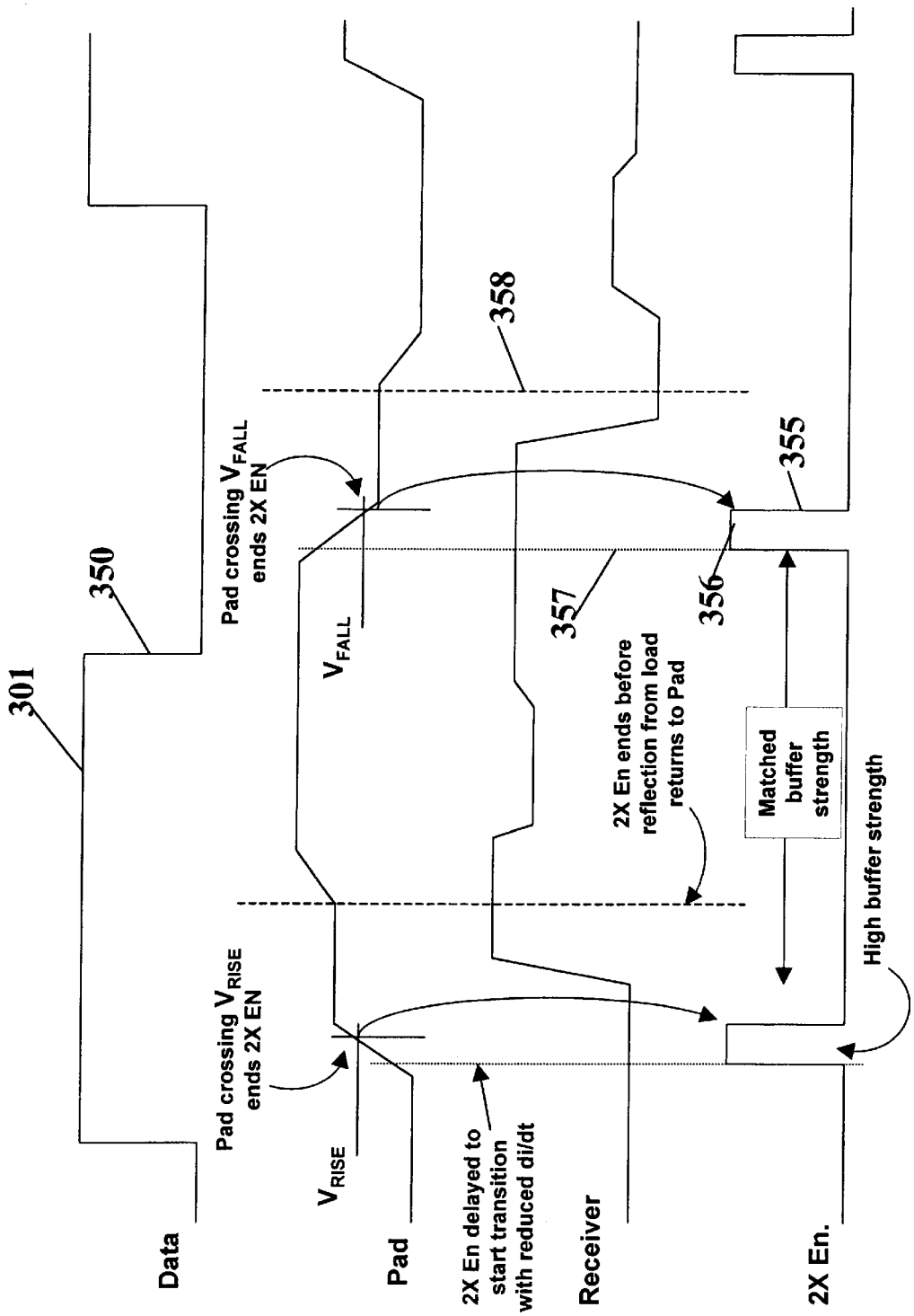
FIG. 6 is a waveform diagram helpful in understanding the operation of the embodiment of FIG. 4.

For example, with a date transition of data 10 from high to low, as shown by the data transition at edge 350 of FIG. 6, the output of comparator 57 will be high and with the switching of multiplexer 61, this will be applied to gate 55 to enable it and the buffer driver 17 as shown by waveform 356 after a delay through the logic allowing a soft start to limit di/dt. The delay from the start of the falling edge at output pad 18 is indicated by dotted line 357. As the data output at pad 18 transitions from high to low, when $V_{FALL}$ is passed, the output of comparator 57 will change, be coupled through multiplexer 61 and will disable gate 55, as shown at 355 of FIG. 6, to disable the buffer driver 17. The return to a substantially matched buffer strength, shown at edge 355, occurs well before dashed line 358, indicating the time at which the reflection from the load returns to the pad. A similar operation takes place with comparator 59 when transitioning from low to high data, as is readily apparent from FIG. 6.

Figure 7:
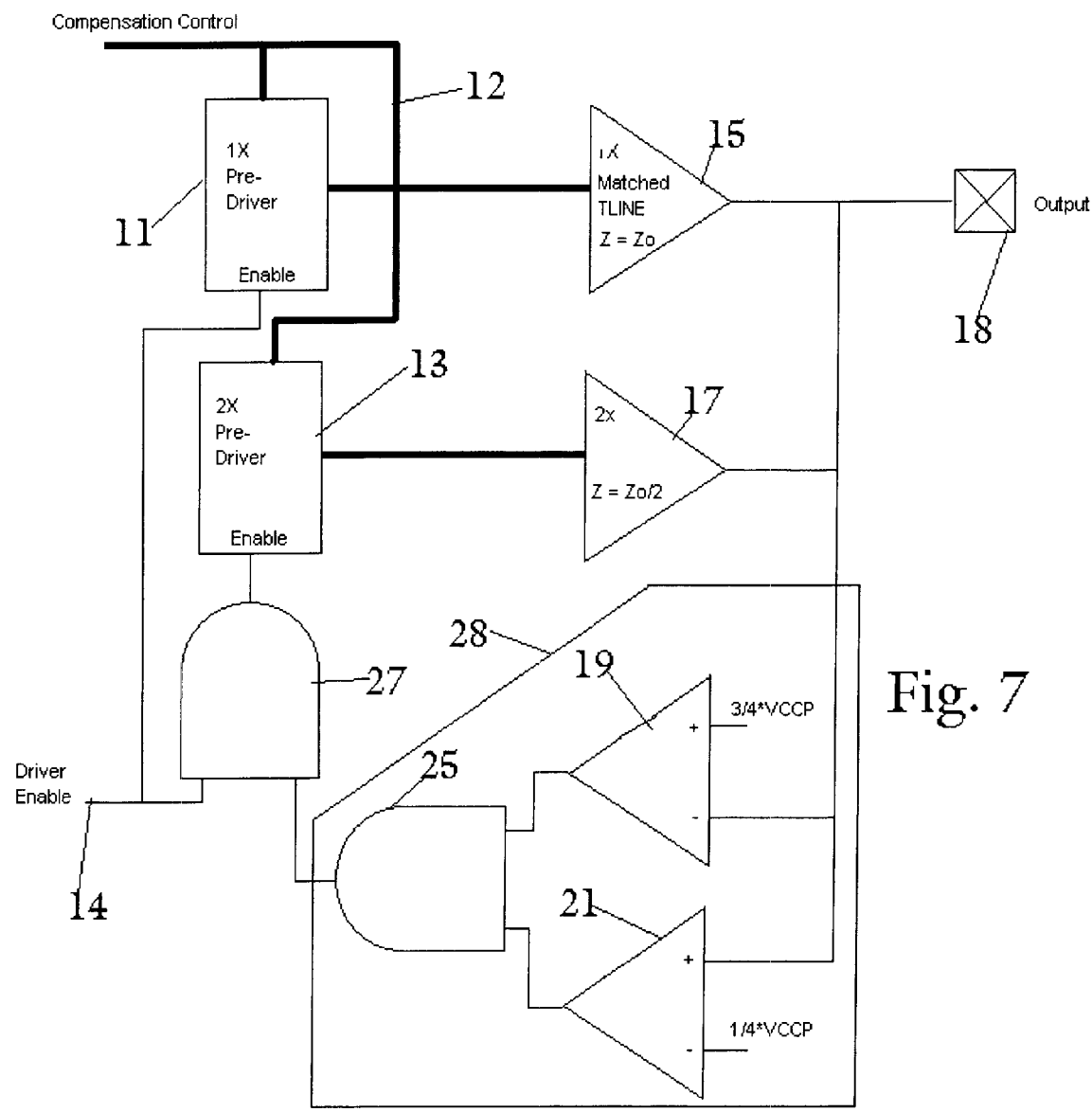
FIG. 7 is a block/logic diagram of an embodiment of a second voltage based buffer control which can be used in the embodiment of FIG. 2.

A further voltage based embodiment is shown in FIG. 7. Two comparators, which may be, for example, differential amplifiers 19 and 21 compare the output at terminal 18 with fixed voltage values to indicate, by providing a logical 0 output from a respective amplifier, that the output voltage is above $¾*V_{CCP}$, or below $¼*V_{CCP}$, respectively. The outputs of amplifiers 19 and 21 are inputs to AND gate 25. When either of the first two conditions are met, one input will be a 1 and the other a 0 and the output of gate 25 will be a logical 0. This output is coupled to gate 27 and will result in a 0 output from that gate. This disables pre-driver 13 and only the matched driver 15 is enabled.

Thus, if the voltage is below $¼*V_{CCP}$, driver 17 stays off to assure a soft start. Between $¾*V_{CCP}$ and $¼*V_{CCP}$, a window exists, during which gate 25, and thus gate 27, is enabled, turning on the pre-driver 13 and driver 17. This provides the strong drive needed to satisfy the load requirements. However, when the voltage exceeds $¾*V_{CCP}$, gates 25 and 27 again become disabled, removing the enable input pre-driver 13, turning off the buffer driver 17. Now only the impedance $Z_0$ is present, properly terminating a reflected pulse. Again, although a rising pulse edge has been assumed, operation with a falling pulse edge would be similar. Then the drop below $¾*V_{CCP}$ would turn the driver 17 on and the drop below $¾*V_{CCP}$ would turn it off.

Figure 8:
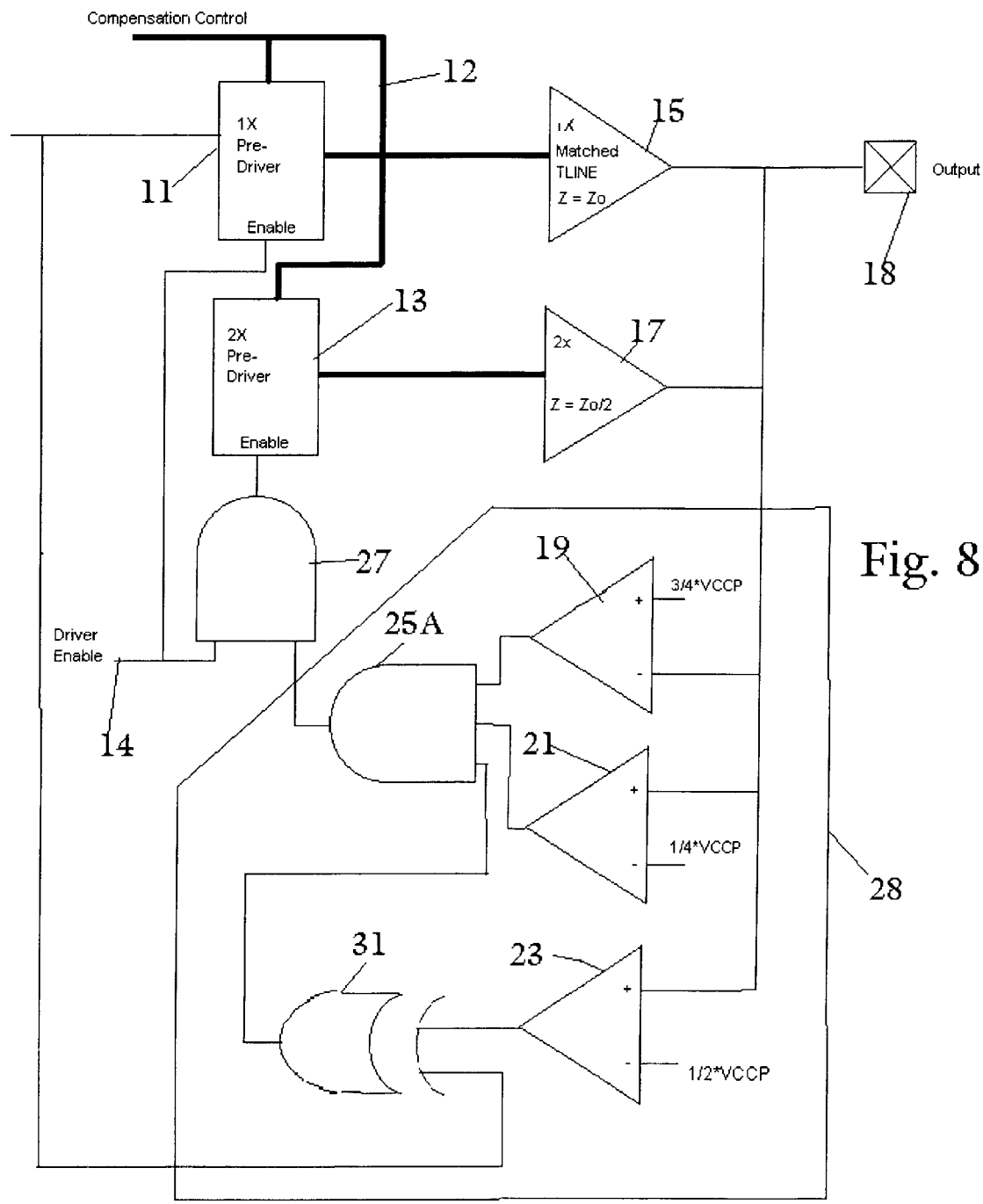
FIG. 8 is a block/logic diagram of an embodiment of a third voltage based buffer control which can be used in the embodiment of FIG. 2.
Figure 8:
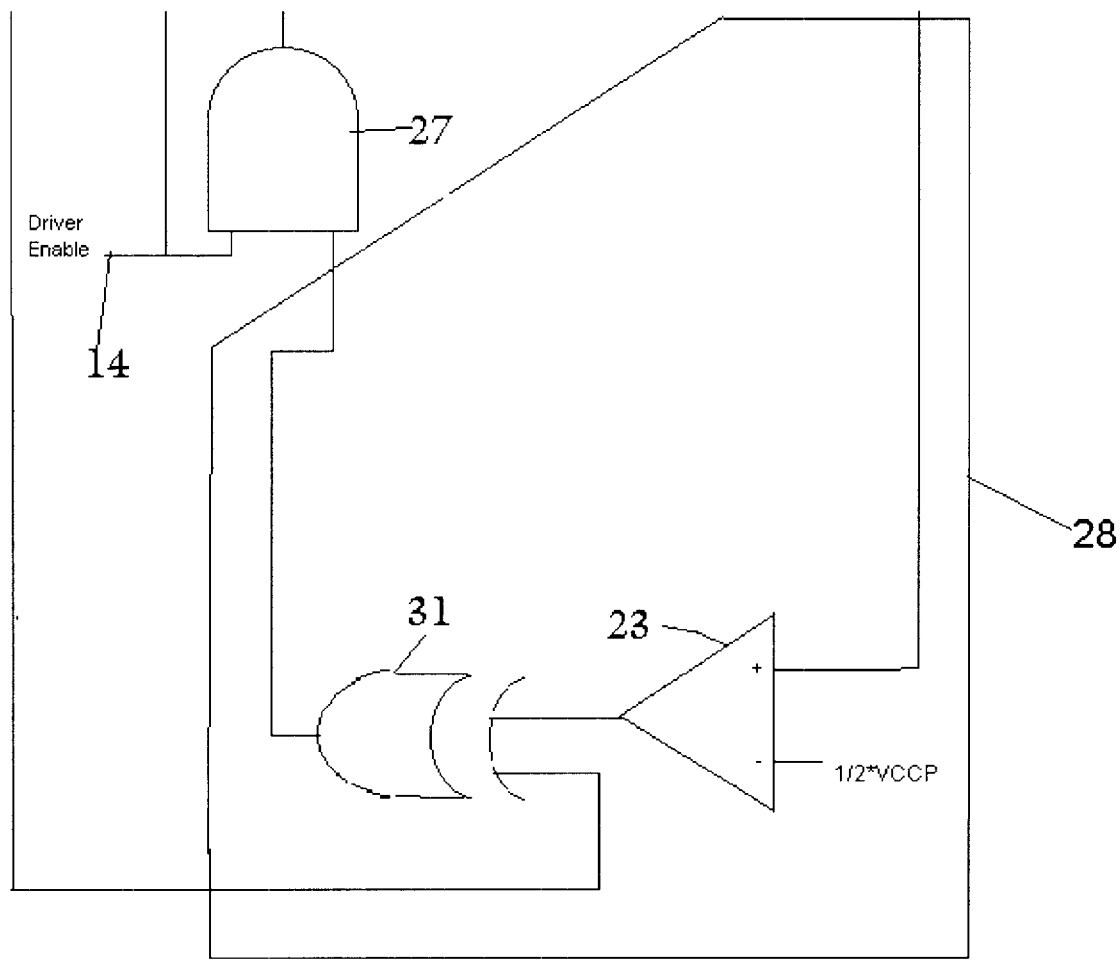

A further voltage based embodiment is illustrated in FIG. 8. This is similar to the embodiment of FIG. 7 and the parts that are the same will not be re-explained. In FIG. 8, AND gate 25A is a three input gate. Gate 25A receives its third input from an exclusive OR gate 31. The output of gate 25A is coupled to one input of AND gate 27. Driver enable line is coupled to the other input of AND gate 27 as in FIG. 7.

Data line 10 is coupled as one input to exclusive Or gate 31. A third differential amplifier 23 compares the output on terminal 18 with $½*V_{CCP}$ and provides its output as a second input to exclusive Or gate 31. This embodiment cuts the enable time of driver 17 from $¼*V_{CCP}$ to $½*V_{CCP}$ for rising edges and from $¾*V_{CCP}$ to $½*V_{CCP}$ for falling edges. This causes the circuit to better meet the requirement of disabling driver 17 before the ledge. Pre-driver 13 will be enabled during the window period, where the voltage is between $¾*V_{CCP}$ and $¼*V_{CCP}$ and the signal is in the first half of its swing, which is indicated by an output from exclusive Or gate 31. The advantage of this circuit is symmetry to rise and fall and avoidance of issues involving timing across the ledge voltage.

In an alternate implementation, the embodiment shown in FIG. 8 can be simplified. Specifically, as shown in FIG. 8A, it is possible to eliminate comparators 19 and 21. Comparator 23 remains to compare the pad output 18 to Vcc/2. The connections to exclusive OR gate 31 remain the same, with the output of gate 31 coupled to the input of gate 27 to provide control of strong buffer pre-driver 13. This modification eliminates two comparators and a three input AND gate. In addition, it allows a faster buffer.

In general it will be recognized that the logic in the figures is directed to examples that illustrate the functionality of the buffer enable control and is not minimized for speed or gate count. Such optimizations are obvious to those skilled in the art. For example, those skilled in the art will recognize that, in a specific design, gates 27 and 25A could be combined into a single four input gate. In that case, the single gate would have inputs from line 14, comparators 19 and 21 and exclusive OR gate 31. Eliminating a gate would eliminate the delay through that gate, resulting in a faster response.

Other methods of timing the z-match could be implemented, especially if the circuitry shown in the block diagram suffers from time delay through the circuitry. For example, a separate, but identical buffer with an internal capacitive load that is not connected to a pin can be used as a reference timer. The swings on this reference buffer will have similar timing to the interface buffers, but not have ledges and other noise signals that make voltage level detection difficult. The sense circuits of FIG. 7 would be sufficient in such a case.

Figure 9:
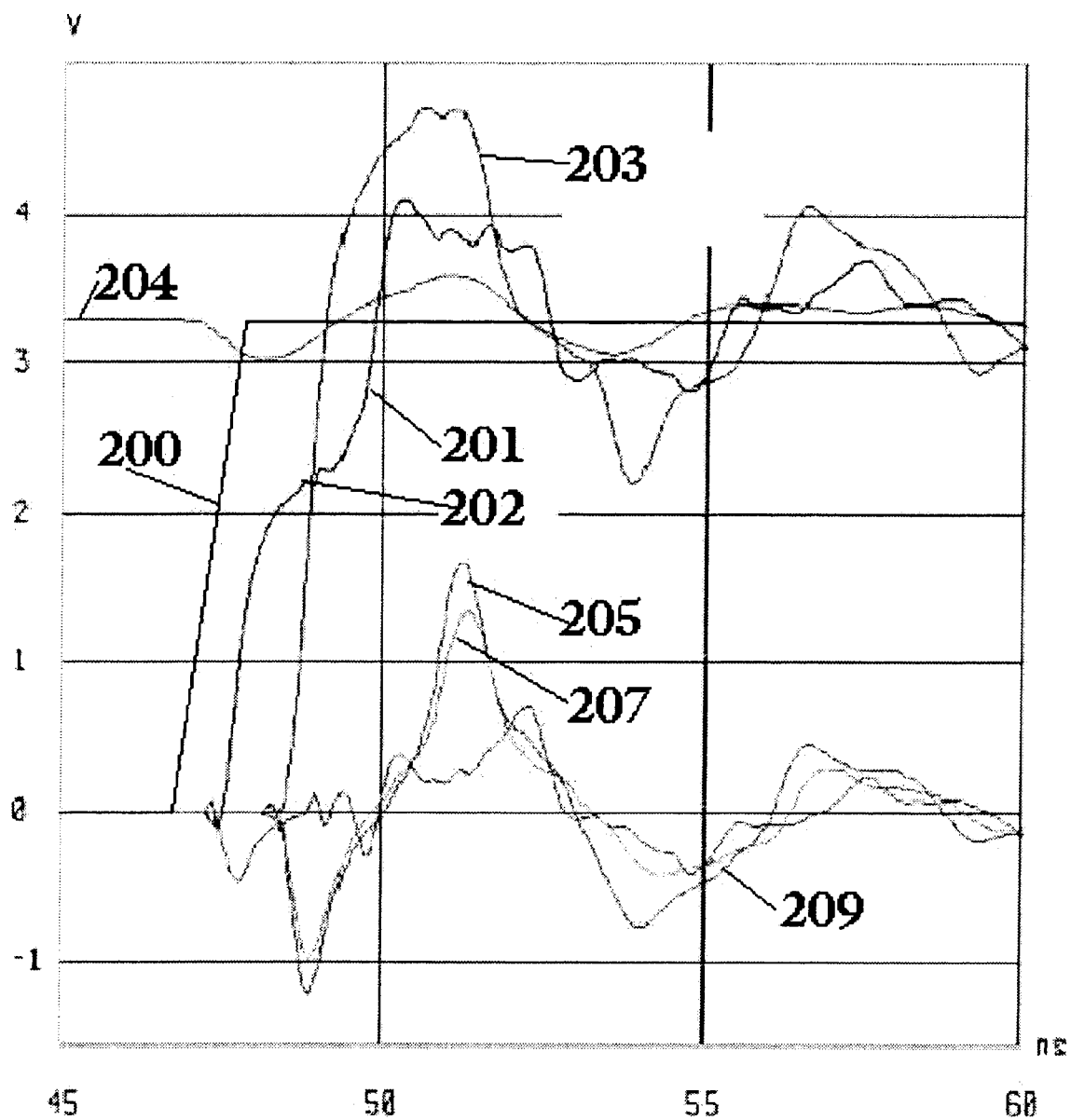
FIG. 9 is a waveform diagram of a simulation helpful in understanding the improvement provided by embodiments of the present invention.

The simulations used to investigate this approach show over a 300 mV improvement in noise using this approach. This is illustrated in FIG. 9. The waveforms are similar to those of FIGS. 5 and 6. Thus, waveform 200 corresponds to the data transition of waveform 301 of FIG. 5. Waveform 201 is the equivalent of waveform 302, the waveform measured at the pad or terminal 18. Point 202 corresponds to the ledge 309 of FIG. 5. The waveform at the receiver, corresponding to 310 of FIG. 5 is waveform 203. Waveform 204 represents the voltage $V_{CCP}$. Waveform 209 is the pad 18 voltage for a quiet line.

Waveform 205 is a quiet line at the load (far end, e.g., a DIMM memory input) when the driver is not substantially matched to the transmission line. Waveform 207 shows the 300 mV reduction in noise at the same load with dynamic impedance switching. This translates to a 20% improvement in noise with this approach. The actual improvement over the prior art (i.e., constant low impedance drivers) could be even higher because simulations have shown the substantially matched quiet line to be much less sensitive to crosstalk noise caused by signal lines changing their power plane reference. This is another aspect of practical circuit board design for surface mount packages.

Embodiments of methods and apparatus for data synchronization have been described. In the foregoing description, for purposes of explanation, numerous specific details are set forth to provide a thorough understanding of the present invention. It will be appreciated, however, by one skilled in the art that the present invention may be practiced without these specific details. In other instances, structures and devices are shown in block diagram form. Furthermore, one skilled in the art can readily appreciate that the specific sequences in which methods are presented and performed are illustrative and it is contemplated that the sequences can be varied and still remain within the spirit and scope of the present invention.

In the foregoing detailed description, apparatus and methods in accordance with embodiments of the present invention have been described with reference to specific exemplary embodiments. Accordingly, the present specification and figures are to be regarded as illustrative rather than restrictive.

What is claimed is:

1. A method of dynamically matching the impedance of a driver to improve slew rate and glitch termination for a signal having an edge transition comprising:

a. during an initial part of the edge transition controlling the driver to have a low impedance;

b. at a first predetermined position in the edge transition, controlling the driver to have a high impedance; and c. compensating the impedances based on a control signal.

2. The method according to claim 1 wherein the low impedance is an impedance which is less than the impedance of a transmission line to which the driver is coupled and the high impedance is substantially equal to the transmission line impedance.

3. The method according to claim 2 wherein the driver comprises first and second buffer drivers, with the first buffer driver having the high impedance and the second buffer driver having an impedance which, when placed in parallel with the first buffer driver will provide the low impedance.

4. The method according to claim 3 wherein the steps of controlling the driver to have a low impedance are carried out by enabling both the first and the second buffer drivers and the step of controlling the driver to have high impedance comprises enabling only the first buffer driver.

5. The method according to claim 4 wherein the impedance of the first buffer driver is substantially equal to the transmission line impedance and the impedance of the second buffer driver is substantially equal to one-half that of the first buffer driver.

6. The method according to claim 5 and further including dynamically controlling the impedances of the first and second buffer drivers to maintain their impedances constant.

7. A method of dynamically matching the impedance of a driver to improve slew rate and glitch termination for a signal having an edge transition comprising:
   a. during an initial part of the edge transition controlling the driver to have a low impedance;
   b. at a first predetermined position in the edge transition, controlling the driver to have a high impedance; and
   c. controlling the driver to have the high impedance at the time the edge transition begins and initiating the step of controlling the driver to have a low impedance at a second predetermined position in the edge transition occurring after the beginning of the edge transition but before the second predetermined position.

8. The method according to claim 7 wherein the low impedance is an impedance which is less than the impedance of a line to which the driver is coupled and the high impedance is substantially equal to the transmission line impedance.

9. A method according to claim 7 comprising sensing the first predetermined position and the second predetermined position based on time.

10. The method according to claim 9 wherein the controlling the driver to have the high impedance at the time the edge transition begins is done by delaying the occurrence of a data transition to which the edge transition corresponds through logic and controlling the driver to have a low impedance at a second predetermined position in the edge transition occurring after the beginning of the edge transition but before the second predetermined position is done by delaying the data transition through a delay element.

11. A method according to claim 7 comprising sensing the first predetermined position and the second predetermined position based on voltage.

12. The method according to claim 11 wherein the controlling the driver to have the high impedance at the time the edge transition begins is done by delaying a signal responsive to the occurrence of a data transition to which the edge transition corresponds through logic and controlling the driver to have a low impedance at a second predetermined position in the edge transition occurring after the beginning of the edge transition but before the second predetermined position is done by comparing the voltage of the edge transition with a predetermined value.

13. The method according to claim 11 comprising comparing the voltage of the edge transition with a first predetermined value for a falling edge and to a second predetermined voltage for a rising edge.

14. A method according to claim 7 wherein the other end of the transmission line is coupled to a load and the first predetermined position is substantially at position corresponding to a flight time from the driver to the load.

15. A method of dynamically matching the impedance of a driver to improve slew rate and glitch termination for a signal having an edge transition comprising:
   a. enabling a first buffer driver coupled to a transmission line over which the signal is to be sent and having a first impedance prior to an edge transition;
   b. during an initial part of the edge transition enabling a second buffer driver, coupled in parallel with the first buffer driver, and having a second impedance;
   c. at a first predetermined position in the edge transition, disabling the second buffer driver; and
   d. compensating the impedance based on a control signal.

16. The method according to claim 15 wherein the first impedance is substantially matched to the transmission line.

17. Apparatus to dynamically match the impedance of a driver to improve slew rate and glitch termination for a signal having an edge transition comprising:
   a. a first buffer driver to be coupled to a transmission line over which the signal is to be sent and having a first impedance;
   b. a second buffer driver coupled in parallel with the first buffer driver having a second impedance, the impedances being compensated based on a control signal; and
   c. a buffer enable control to enable both the first and second buffer drivers during an initial portion of an edge transition and to disable the second buffer driver at a first predetermined position in the edge transition.

18. Apparatus according to claim 17 wherein the first impedance is substantially matched to the transmission line.

19. Apparatus according to claim 17 and further including first and second pre-driver providing inputs to the first and second buffer drivers, the buffer enable control coupled to enable and disable the-second pre-driver, to enable and disable its associated buffer driver.

20. Apparatus according to claim 19 and wherein the first and second buffer drivers have a capability for dynamic control of their the impedances and the first and second pre-drivers are coupled to provide inputs to control the impedances of the first and second buffer drivers.

21. Apparatus to dynamically match the impedance of a driver to improve slew rate and glitch termination for a signal having an edge transition comprising:
   a. a first buffer driver to be coupled to a transmission line over which the signal is to be sent and having a first impedance;
   b. a second buffer driver coupled in parallel with the first buffer driver having a second impedance;
   c. a buffer enable control to enable both the first and second buffer drivers during an initial portion of an edge transition and to disable the second buffer driver at a first predetermined position in the edge transition, wherein the buffer enable control is further arranged to enable the second buffer driver at a second predetermined position in the edge transition occurring after the beginning of the edge transition but before the second predetermined position; and
   d. first and second pre-driver providing inputs to the first and second buffer drivers, the buffer enable control coupled to enable and disable the-second pre-driver, to enable and disable its associated buffer driver.

22. Apparatus according to claim 21 wherein the buffer enable control comprises:
   a. a first comparator having a negative input coupled to the output of the first and second buffer drivers and a positive input coupled to a first voltage value corresponding a voltage level equal to said first predetermined level required for a rising edge;
   b. a second comparator having a positive input coupled to the output of the first and second buffer drivers and a negative input coupled to a second voltage value corresponding a voltage level equal to said first predetermined level required for a falling edge; and
   c. a multiplexer having outputs of the first and second gates coupled as inputs, a data line, which is also coupled to inputs of the first and second pre-drivers as a selection input and having an output coupled to an enable input of the second pre-driver.

23. Apparatus according to claim 22 and further including;
   a. a first gate, performing an ANDing function having the output of the multiplexer as one input and a driver enable line as a second input and an output coupled to the enable input of the second pre-driver.

24. Apparatus according to claim 21 wherein the buffer enable control comprises;
   a. a first gate performing an exclusive OR function having one input coupled to a data line, which is also coupled to inputs of the first and second pre-drivers; and
   b. a delay element having an input coupled to the data line and an output coupled to an enable input of the second pre-driver.

25. Apparatus according to claim 24 and further including;
   a. a second gate, performing an ANDing function having the output of the exclusive OR gate as one input and a driver enable line as a second input and an output coupled to the enable input of the second pre-driver.

26. Apparatus according to claim 21 wherein the buffer enable control comprises:
   a. a first comparator having its negative input coupled to the output of the first and second buffer drivers and its positive input coupled to a first voltage value corresponding to the one of the first and second predetermined levels;
   b. a second comparator having its positive input coupled to the output of the first and second buffer drivers and its negative input coupled to a second voltage value corresponding to the other of the first and second predetermined levels;
   c. a first gate, performing an ANDing function having outputs of the first and second gates coupled as inputs and having an output coupled to an enable input of the second pre-driver.

27. Apparatus according to claim 26 wherein the first voltage value is approximately ¾ of a voltage supplied to the first and second buffer drivers and the second voltage is approximately ¼ of the voltage supplied to the first and second buffer drivers.

28. Apparatus according to claim 23 and further comprising:
   a. a second gate performing an exclusive OR function having an output coupled to an input of the first gate and one input coupled to a data line, also coupled as in input to the first and second pre-drivers; and
   b. a third comparator having a positive input coupled to the output of the first and second buffer drivers and a negative input coupled to a voltage value corresponding to approximately one-half of the value of a voltage supplied to the first and second buffer drivers, having an output coupled as a third input to the first gate.

29. Apparatus according to claim 21 wherein the buffer enable control comprises:
   a. a gate performing an exclusive OR function having an output coupled to an enable input of the second pre-driver and one input coupled to a data line that is also coupled as in input to the first and second pre-drivers; and
   b. a comparator having a positive input coupled to the output of the first and second buffer drivers and a negative input coupled to a voltage value corresponding to approximately one-half of the value of a voltage supplied to the first and second buffer drivers, and having an output coupled as a second input to the gate.

30. A method of dynamically matching the impedance of a driver to improve slew rate and glitch termination for a signal having an edge transition comprising:
   a. enabling a first buffer driver coupled to a transmission line over which the signal is to be sent and having a first impedance prior to an edge transition;
   b. during an initial part of the edge transition enabling a second buffer driver, coupled in parallel with the first buffer driver, and having a second impedance;
   c. at a first predetermined position in the edge transition, disabling the second buffer driver; and
   d. enabling the second buffer driver at a second predetermined position in the edge transition occurring after the beginning of the edge transition but before the second predetermined position.

* * * * *